(12) United States Patent
Kangas

(10) Patent No.: US 7,661,776 B2
(45) Date of Patent: Feb. 16, 2010

(54) ARRANGEMENT FOR DETACHABLY FASTENING A COMPONENT TO A FRAME PART

(75) Inventor: Simo Kangas, Vaasa (FI)

(73) Assignee: ABB Oy, Helsinki (FI)

( * ) Notice: Subject to any disclaimer, the term of this patent is extended or adjusted under 35 U.S.C. 154(b) by 623 days.

(21) Appl. No.: 10/555,699

(22) PCT Filed: May 5, 2004

(86) PCT No.: PCT/FI2004/000272

§ 371 (c)(1),
(2), (4) Date: Nov. 4, 2005

(87) PCT Pub. No.: WO2004/100635

PCT Pub. Date: Nov. 18, 2004

(65) Prior Publication Data

US 2006/0273599 A1      Dec. 7, 2006

(30) Foreign Application Priority Data

May 9, 2003    (FI)    .................................. 20030702

(51) Int. Cl.
*E05C 7/06*    (2006.01)
(52) U.S. Cl. ....................................... 312/222; 292/195
(58) Field of Classification Search .................. 16/422, 16/444, 445; 403/322.4, 323, 325, 330; 292/195, 292/197, 200, 210; 312/332.1, 223.2, 327, 312/328
See application file for complete search history.

(56) References Cited

U.S. PATENT DOCUMENTS

| | | | | |
|---|---|---|---|---|
| 3,398,487 A | * | 8/1968 | Matyas | ......................... 49/239 |
| 4,672,699 A | * | 6/1987 | Goodwin | ......................... 5/430 |
| 5,010,426 A | | 4/1991 | Krenz | |
| 5,117,707 A | * | 6/1992 | Kinoshita et al. | ............. 74/493 |
| 6,081,431 A | | 6/2000 | Lemke | |
| 6,207,909 B1 | | 3/2001 | Tallman et al. | |
| 6,381,146 B1 | | 4/2002 | Sevier | |
| 6,568,004 B1 | * | 5/2003 | Sun | ............................. 5/99.1 |

OTHER PUBLICATIONS

*International Search Report, dated Aug. 24, 2004.

* cited by examiner

*Primary Examiner*—José V Chen
*Assistant Examiner*—Matthew W Ing
(74) *Attorney, Agent, or Firm*—Buchanan Ingersoll & Rooney PC

(57) ABSTRACT

A fastening arrangement for detachably fastening a component (2) to a frame part (4). The arrangement comprises a handle means (6) pivoted to the frame part (4) and an arranged to turn about its pivoting axis (12) between a normal position and a release position, and locking means (14, 16) arranged such that when the handle means (6) is in its normal position, inserting the component (2) into its position arranged in the frame part (4) causes the component (2) to be locked into the frame part (4). The arrangement also comprises means (18, 20) for opening the locking and arranged such that turning the handle means (6) to its release position releases the locking of the component (2) in relation to the frame part (4).

9 Claims, 2 Drawing Sheets

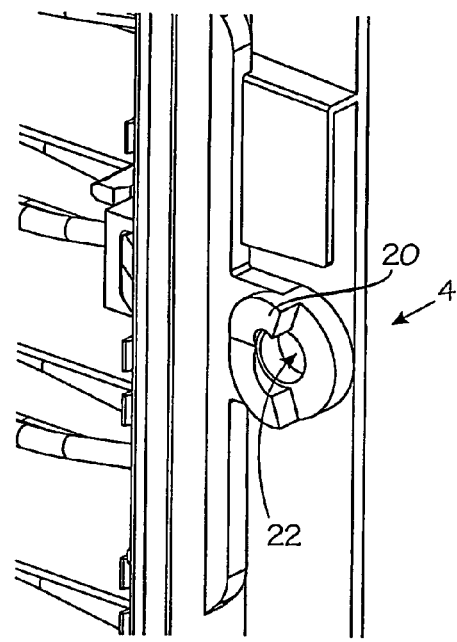
Fig. 2a
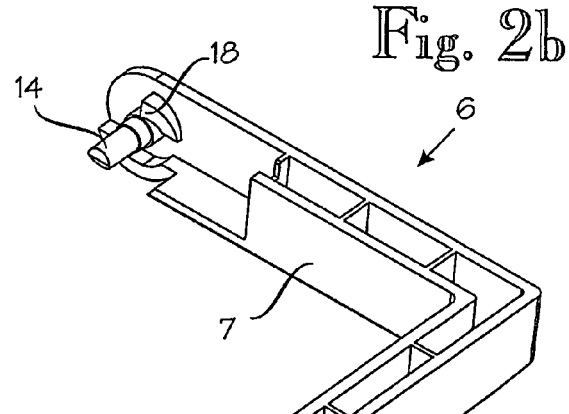
Fig. 2b
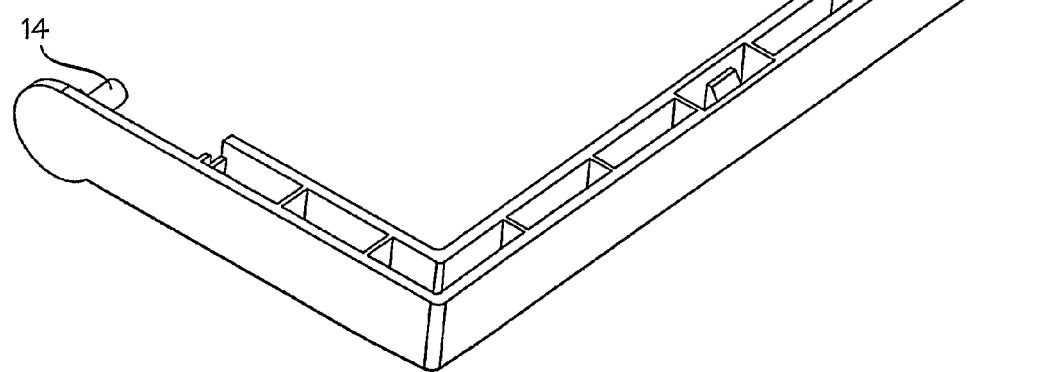

ARRANGEMENT FOR DETACHABLY FASTENING A COMPONENT TO A FRAME PART

This disclosure is based upon Finland Application No. 20030702, filed May 9, 2003, and International Application No. PCT/FI2004/000272, filed May 5, 2004, the contents of which are incorporated herein by reference.

BACKGROUND OF THE INVENTION

The invention relates to an arrangement for detachably fastening a component to a frame part.

Many devices comprise an interface unit or another corresponding component that is to be detachably fastened to said device for service and repair, for example. In the plug-in units of plug-in unit assemblies, for example, it is known to use an interface unit fastened to the front surface of the plug-in unit, the interface unit comprising a liquid crystal display and switches required for controlling components comprised by the plug-in unit. It is known to fasten the interface unit to the front surface of the plug-in unit with screws or fixing clips, for example.

It is relatively time consuming to fasten an interface unit to a plug-in unit by screwing or with fixing clips. A further problem is caused by lost screws and damage to quick-release locks, for example, depending on the fastening method used.

BRIEF DESCRIPTION OF THE INVENTION

The object of the invention is to provide an arrangement for detachably fastening a component to a frame part in a manner solving the above problems.

The invention is based on accomplishing a frame part provided with a handle means, the component being detachable from the frame part by turning the handle means, and the component being lockable into the frame part simply by inserting it into position while the handle means is in its normal position.

An advantage of the arrangement of the invention is fast fastening and detaching of the component. In addition, the component fastening arrangement of the invention can be implemented without loose fastening means, if desired.

BRIEF DESCRIPTION OF THE FIGURES

In the following, preferred embodiments of the invention will be described in detail with reference to the accompanying drawings, in which

FIG. 2a shows a cam surface provided in the frame part of the arrangement of FIG. 1; and FIG. 2b shows a handle means of the arrangement of FIG. 1.

DETAILED DESCRIPTION OF THE INVENTION

Figure 1:
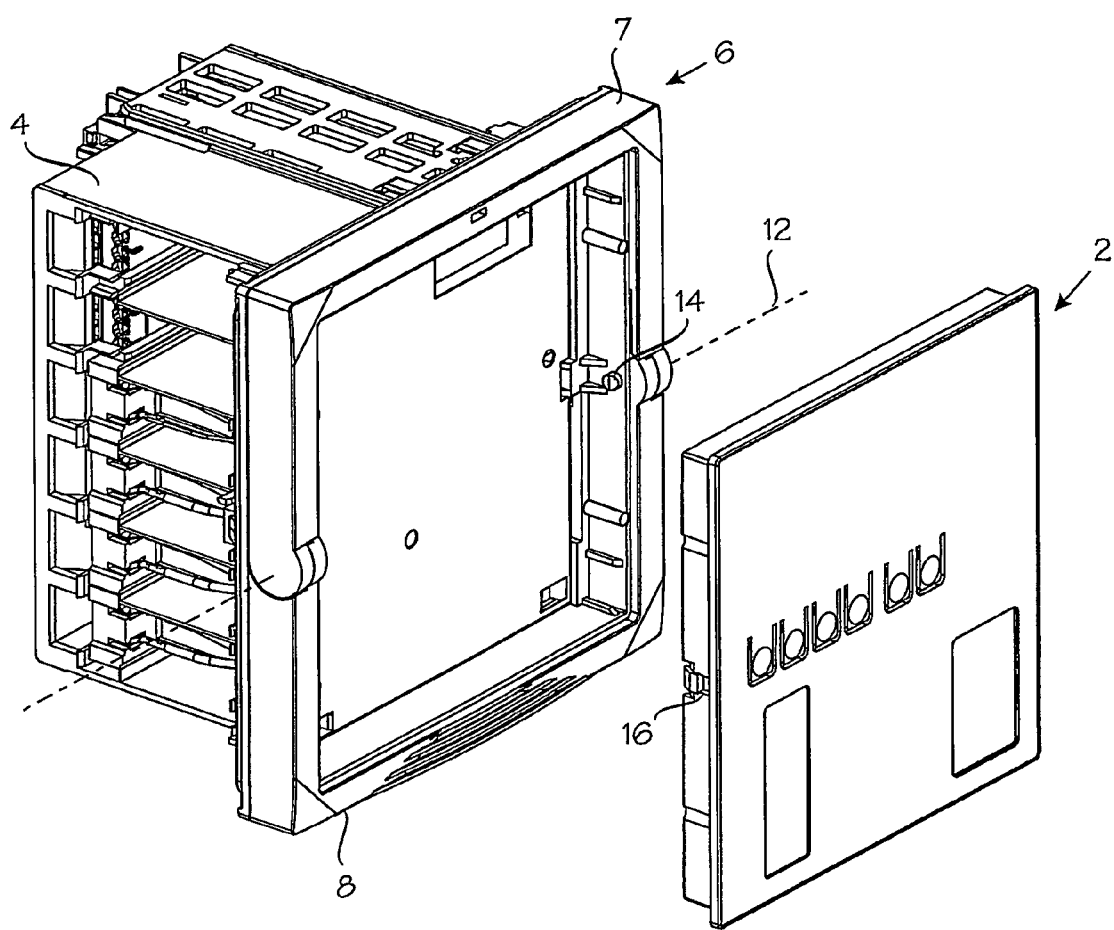
FIG. 1 shows a fastening arrangement according to an embodiment of the invention.

FIG. 1 shows an arrangement according to an embodiment of the invention for detachably fastening a component 2, for example, a user interface unit, to a frame part 4. The arrangement comprises a handle means 6 pivoted to the frame part 4 and arranged to turn about its pivoting axis 12 between a normal position and a release position, and locking means arranged such that when the handle means 6 is in its normal position, the insertion of the component 2 into a position arranged for it in the frame part 4 causes the component 2 to be locked into the frame part 4. In addition, the arrangement comprises means for opening the locking that are arranged such that turning the handle means 6 to its release position releases the locking of the component 2 in relation to the frame part 4.

In the arrangement of FIG. 1, in addition to the handle means 6, also an auxiliary handle 8 is pivoted to the frame part 4, the auxiliary handle also being arranged to turn about an axis 12 between its normal position and its operational position. In FIG. 1, both the handle means 6 and the auxiliary handle 8 are in their normal position, being located substantially in a plane parallel to the front surface of the frame part 4.

The locking means of the arrangement of FIG. 1 comprise two centre pins 14 provided in the handle means 6, and two recesses 16 provided in the component 2 and arranged to receive the corresponding centre pins 14 at least partly.

The centre pins 14 extend parallel to the pivoting axis 12 and coaxially therewith. The centre pins 14 are movable parallel to the pivoting axis 12 and thus have an opening direction and a closing direction, the directions being mutually opposite. In the arrangement of FIG. 1, the opening direction is outwards in relation to the frame part 4, the closing direction being inwards in relation to the frame part 4.

The centre pins 14 have a normal position, a locking position and an opening position. In the situation according to FIG. 1, wherein the handle means 6 is in its normal position, and the component 2 is detached from the frame part 4, the centre pins 14 are in their normal positions.

When the component 2 starts to be pushed towards its position arranged in the frame part 4, the surfaces of the component 2 adjacent the recesses 16 hit the free, bevelled ends of the centre pins 14. When the pushing of the component is continued, said surfaces adjacent the recesses 16 cooperate with the centre pins 14 moving the centre pins 14 in their opening direction. Once the centre pins 14 are moved from their normal position a predetermined distance in their opening direction, the centre pins 14 reach their opening position, wherein they allow the component 2 to be inserted into its position arranged in the frame part 4.

Once the component 2 is inserted into its position arranged in the frame part 4, the centre pins 14 are free to move in their closing direction, whereby they penetrate into the corresponding recesses 16. Having moved the predetermined distance in relation to their opening position, the centre pins 14 reach their locking position. When in the locking position, the centre pins 14 are inside the recesses 16, the centre pins 14 cooperating with the walls of the recesses 16 preventing the detachment of the component 2 from the frame part 4. The locking position of the centre pins 14 is preferably substantially the same as their normal position.

In the fastening arrangement of FIG. 1, when the centre pins 14 are moved in their opening direction from their normal position, the centre pins 14 are subjected to a return force that tends to return the centre pins 14 to their normal position. In the arrangement of FIG. 1, said return force is generated by the properties of the handle means 6. Return means, which tend to return the centre pins 14 to their normal position, may comprise, not only the handle means 6, but also one or more helical springs, for example.

The means for opening the locking comprise cam surfaces 18 provided in the handle means 6, and cam surfaces 20 provided in the frame part 4, the cam surfaces 18 and 20 being arranged to cooperate for moving the centre pins 14 in the opening direction.

FIG. 2a shows one of the two cam surfaces 20 provided in the frame part 4. In FIG. 2a, both the handle means 6 and the auxiliary handle 8 are detached from the frame part 4. The cam surface 20 of the frame part perimetrically encircles an opening 22 provided in the frame part 4, the centre pin 14, and thus also the pivoting axis 12 of the handle means 6 passing through said opening when the handle means 6 is installed in the frame part 4.

The cam surface 20 encircles the opening 22 at an angle slightly exceeding 180°. The boundary between the part of the periphery wherein the cam surface 20 is provided and the part that is not provided with a cam surface passes substantially vertically, i.e. the boundary is substantially parallel to the plane wherein the handle means 6 is located when in its normal position.

The cam surface 20 is symmetric in relation to a plane that is perpendicular in relation to the front surface of the frame part 4 and in which plane the pivoting axis 12 passes. Consequently, both symmetrical parts of the cam surface 20 encircle the opening 22 at an angle of about 90°. At the point where the symmetrical parts are adjacent, the cam surface 20 is substantially in the plane of the frame part 4. The projections in the symmetrical parts of the cam surface 20 in relation to the frame part 4 increase when passing circumferentially away from the point where the symmetrical parts are adjacent. In relation to the frame part 4, the projections of the symmetrical parts of the cam surface 20 are at their largest at the points that are circumferentially farthest away in relation to the point where the symmetrical parts are adjacent.

FIG. 2b shows the handle means 6, detached from the frame part 4. The handle means 6 comprises a substantially U-shaped turning handle 7, whose ends are provided with the centre pins 14.

The handle means 6 is preferably made from a flexible material. The flexibility and suitable design of the handle means 6 enable the generation of the above-mentioned return force to which the centre pins 14 are subjected and which tends to return the centre pins 14 to their normal position, if deflected from it. For example, a substantially U-shaped turning handle 7 according to FIG. 2b, made from a flexible material, tends to revert to its original shape if its ends are moved in relation to each other parallel to the pivoting axis 12. Since the centre pins 14 are provided at the ends of the turning handle 7, the return force generated by the flexibility of the turning handle 7 tends to keep the centre pins 14 in their normal positions.

When the handle means 6 according to FIG. 2b is being installed into the frame part 4, the ends of the U-shaped turning handle 7 are stretched apart parallel to the pivoting axis 12 to such a degree that the distance between the free ends of the centre pins 14 is longer than or equal to the lateral distance between the edges of the corresponding openings 22, allowing the centre pins 14 to be installed into the corresponding openings 22. When the centre pins 14 are inserted into the corresponding openings 22, the flexibility of the turning handle 7 maintains the handle means 6 in position, and thus no separate fastening means are required.

In the case of the assembly according to FIG. 1, the auxiliary handle 8 is installed before the handle means 6.

The handle means 6 is preferably made integral. The handle means 6 can be made from a plastic material, for example.

The handle means 6 is provided with a cam surface 18, which protrudes from the turning handle 7, adjacent each centre pin 14. The cam surfaces 18 of the handle means are arranged to cooperate with the corresponding cam surfaces 20 provided in the frame part to move the centre pins 14 in the opening direction.

The cam surfaces 18 of the handle means 6 perimetrically encircle the corresponding centre pins 14. Each cam surface 18 encircles the corresponding centre pin 14 at an angle slightly exceeding 90°. The shape of the cam surface 18 of the handle means 6 is substantially similar to a half of the cam surface 20 of the frame part, i.e. the projection of the cam surface 18 in relation to the turning handle 7 increases evenly circumferentially.

The design of the cam surfaces 20 of the frame part 4 and the cam surfaces 18 of the handle means 6 shown in FIGS. 2a and 2b enables the installation of the handle means 6 into the frame part 4 in two different positions. Consequently, in the normal position of the handle means 6, the turning handle 7 may extend upwards or downwards from the pivoting axis 12.

When the handle means 6 is installed such that the turning handle 7 points upwards in the normal position of the handle means 6, as in FIG. 1, the cam surfaces 18 of the handle means cooperate with the upper symmetrical parts of the cam surfaces 20 provided in the frame part. Correspondingly, when the handle means 6 is installed such that the turning handle 7 points downwards in the normal position of the handle means 6, the cam surfaces 18 of the handle means cooperate with the lower symmetrical parts of the cam surfaces 20 provided in the frame part.

When the handle means 6 is in its normal position, the most protruding portion of the cam surface 18 of the handle means is adjacent to the portion of the corresponding cam surface 20 of the frame part that protrudes the least from the frame part 4, whereas the least protruding portion of the cam surface 18 of the handle means is adjacent to the portion of the corresponding cam surface 20 that protrudes the most from the frame part 4.

When the handle means 6 is in its normal position, both of its cam surfaces 18 are preferably in contact with the corresponding cam surface 20 of the frame part.

When the handle means 6 is turned from the normal position towards the release position, the most protruding parts of the nose parts 18 of the handle means move circumferentially towards the most protruding parts of the corresponding nose parts 20 of the frame part, whereby the centre pins 14 move towards their opening position. In other words, when the handle means 6 is turned from the normal position towards the release position, the distance between the free ends of the centre pins 14 increases, whereby the centre pins 14 move outwards from the corresponding recesses 16.

When the handle means 6 is turned to its release position, the centre pins 14 reach their opening position, allowing the component 2 to be detached from the frame part 4. When in its release position, the handle means 6 is turned by a given angle γ about the pivoting axis 12 in relation to its normal position. Angle γ may be within the range $45° \leq \gamma \leq 90°$, for example. It is to be noted that when the component 2 is being installed into the frame part 4, the handle means 6 does not have to turn from its normal position although the centre pins 14 move in the opening direction.

The return force, generated by the flexibility of the handle means 6, and parallel to the pivoting axis 12, and the design of the cam surfaces 18 and 20 cause the handle means 6 to tend to return to its normal position. When desired, the arrangement may also be provided with a torsion spring, for example, which enhances the return of the handle means 6 to its normal position.

There may be one or more centre pins 14 in the fastening arrangement of the invention. The centre pins 14 may be provided either in the handle means 6 or in the component 2. The movable parts of the centre pin/recess pairs are preferably placed in the handle means 6.

When the centre pins 14 are placed in the handle means 6 and the cross section of the centre pins 14 is selected to be round, the centre pins 14 can be utilized as shafts, supported by which the handle means 6 can be turned between its normal position and its release position.

When the fastening arrangement of the invention is used in an assembly comprising an auxiliary handle 8, the handle means 6 and the centre pins 14 provided therein can be utilized in fastening the auxiliary handle 8. For example, in an auxiliary handle 8 used with the handle means 6 according to FIG. 2b, openings can be provided through which the centre pins 14 pass when the handle means 6 and the auxiliary handle 8 are installed in the frame part 4, whereby the centre pins 14 of the handle means 6 prevent the auxiliary handle 8 from moving in the radial direction of the pivoting axis 12, but allow the auxiliary handle 8 to turn about the pivoting axis 12. Since the handle means 6 according to FIG. 2b is installed farther out in the direction of the pivoting axis 12 than the auxiliary handle 8, the handle means 6 supports the auxiliary handle 8 also in the direction of the pivoting axis 12. Accordingly, the auxiliary handle 8 can be fastened to the frame part 4 only by means of the handle means 6, whereby no separate fastening parts are required.

When the assembly comprises an auxiliary handle 8, the shapes of the turning handle 7 and the auxiliary handle 8 can be designed substantially the same, as in the example of FIG. 1. This renders the appearance of the assembly balanced.

The functions of the auxiliary handle 8 may be associated for instance with the fastening and detaching of the frame part 4. For example, in cases where the frame part 4 is a plug-in unit in a plug-in unit assembly, the functions of the auxiliary handle 8 may be associated with the fastening between the plug-in unit and its case.

The fastening arrangement of the invention is preferably provided with a means for fabricating the handle means, the fabrication means having an open position and a closed position and the fabrication means ensuring that the handle means 6 is not accidentally turned from its normal position. Herein, the open position of the means for fabricating the handle means refers to a position allowing the handle means 6 to be turned from its normal position, and the closed position of the means for fabricating the handle means refers to a position preventing the turning of the handle means 6.

The means for fabricating the handle means can comprise for instance a projection that locks the handle means 6 into the frame part 4. The projection may be arranged to be pushed into its open position with a screwdriver, for example.

The means for fabricating the handle means is useful particularly in arrangements comprising an auxiliary handle 8 in addition to the handle means 6. The means for fabricating the handle means is particularly useful in arrangements wherein the appearances of the handle means 6 and the auxiliary handle 8 are alike.

The fastening arrangement of the invention relates to the mechanical fastening of the component 2 to the frame part 4. If power and/or information are to be transferred between the component 2 and the frame part 4, a known means, such as an electric line or a communications cable can be used for these tasks.

It is obvious to a person skilled in the art that the basic idea of the invention can be implemented in a variety of ways. The invention and its embodiments are thus not limited to the above examples, but may vary within the scope of the claims.

The invention claimed is:

1. A fastening arrangement for detachably fastening a component to a frame part, the arrangement comprising:
   a frame part;
   a component;
   a means for pivoting pivotable to the frame part and arranged to turn about a pivoting axis between a normal position and a release position,
   a locking means comprising at least one centre pin provided in the means for pivoting, and at least one recess provided in the component and to receive the centre pin at least partly, the centre pin being movable in an opening direction away from the recess and in a closing direction toward the recess, the directions being mutually opposite and substantially parallel to the pivoting axis of the means for pivoting, the centre pin having an opening position whereby the centre pin is arranged to be outside the recess and a locking position whereby the centre pin is arranged to be within the recess, the centre pin being located substantially coaxially with the pivoting axis of the means for pivoting and having a free end which is bevelled and cooperates with the component such that when the component is pushed towards a position arranged in the frame part, the component co-operates with said free end of the centre pin moving the centre pin in the opening direction until the centre pin reaches the opening position which allows the component to be pushed into the position arranged in the frame part, the locking means further comprising return means arranged to bias the centre pin into the locking position if the centre pin is deflected from the locking position, such that when the means for pivoting is in its normal position, inserting the component into the position arranged in the frame part causes the component to be locked into the frame part;
   means for opening the locking comprise a cam surface provided in the means for pivoting, and a cam surface provided in the frame part, the cam surfaces being arranged to co-operate with each other to move the centre pin in the opening direction when the means for pivoting is pivoted from the normal position in the direction of the release position such that turning the means for pivoting from its normal position to its release position moves the centre pin from the locking position to the opening position thereby releasing the locking of the component in relation to the frame part and allowing the component to be detached from the frame part.

2. A fastening arrangement as claimed in claim 1, wherein the cam surfaces are located adjacent the pivoting axis of the means for pivoting.

3. A fastening arrangement as claimed in claim 1, wherein said return means comprise the means for pivoting made from a flexible material.

4. A fastening arrangement as claimed in claim 3, wherein the means for pivoting comprises a substantially U-shaped turning handle, and the pivoting axis passes substantially via the free ends of the U.

5. A fastening arrangement as claimed in claim 1, wherein the thickness of the component to be fastened to the frame part is substantially smaller than a width and a height of the component, and when the component is locked into the frame part, the plane defined by the width and height of the component is substantially parallel to a front surface of the frame part.

6. A fastening arrangement as claimed in claim 1, wherein the component is a user interface unit.

7. A fastening arrangement as claimed in claim 1, wherein the means for pivoting is arranged to be it is usable for fastening an auxiliary handle to the frame part, the auxiliary handle being arranged to turn about the pivoting axis between a normal position and an operational position.

8. A fastening arrangement as claimed in claim 7, wherein the means for pivoting is arranged to support the auxiliary handle both in the direction of the pivoting axis and in a radial direction of the pivoting axis.

9. A fastening arrangement as claimed in claim 1, wherein the frame part is a plug-in unit of a plug-in unit assembly.

* * * * *

UNITED STATES PATENT AND TRADEMARK OFFICE
CERTIFICATE OF CORRECTION

PATENT NO. : 7,661,776 B2 Page 1 of 1
APPLICATION NO. : 10/555699
DATED : February 16, 2010
INVENTOR(S) : Simo Kangas It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1087 days.

Signed and Sealed this

Thirtieth Day of November, 2010

David J. Kappos
*Director of the United States Patent and Trademark Office*